US010810348B1

(12) United States Patent
Darden

(10) Patent No.: US 10,810,348 B1
(45) Date of Patent: Oct. 20, 2020

(54) CONSTRUCTING COLORABLE WIRING LAYOUTS WITH WIDE WIRES AND SANDWICH RULES

(71) Applicant: International Business Machines Corporation, Armonk, NY (US)

(72) Inventor: Laura R. Darden, Ridgedale, MO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/511,884

(22) Filed: Jul. 15, 2019

(51) Int. Cl.
G06F 17/50 (2006.01)
G06F 30/398 (2020.01)
G06F 30/394 (2020.01)
G06F 30/30 (2020.01)
G06F 30/392 (2020.01)
G03F 7/20 (2006.01)
G02F 1/1362 (2006.01)
G03F 1/70 (2012.01)

(52) U.S. Cl.
CPC .. G06F 30/398 (2020.01); *G02F 2001/13625* (2013.01); *G03F 1/70* (2013.01); *G03F 7/70425* (2013.01); *G06F 30/30* (2020.01); *G06F 30/392* (2020.01); *G06F 30/394* (2020.01)

(58) Field of Classification Search
None
See application file for complete search history.

(56) References Cited

U.S. PATENT DOCUMENTS

| | | | |
|---|---|---|---|
| 8,352,887 B2 * | 1/2013 | Dai | G06F 30/398 716/52 |
| 8,448,100 B1 | 5/2013 | Lin | |
| 8,677,297 B2 * | 3/2014 | Chase | G06F 30/398 716/112 |
| 8,745,556 B2 * | 6/2014 | Chen | G06F 30/392 716/55 |
| 8,782,586 B2 * | 7/2014 | Sezginer | G06F 30/394 716/126 |
| 8,843,867 B2 * | 9/2014 | Chase | G06F 30/398 716/112 |
| 9,009,632 B2 * | 4/2015 | Dai | G06F 30/398 716/52 |
| 9,372,955 B1 | 6/2016 | Lee | |
| 9,396,301 B1 | 7/2016 | Lee | |
| 9,904,756 B1 | 2/2018 | Ruehl | |
| 9,953,126 B2 | 4/2018 | Kodama | |
| 9,971,863 B2 | 5/2018 | Hsu | |
| 10,311,194 B2 * | 6/2019 | Hoover | G03F 1/70 |

(Continued)

FOREIGN PATENT DOCUMENTS

WO 2014078191 A1 5/2014

OTHER PUBLICATIONS

Yu et al, "Layout Decomposition for Quadruple Patterning Lithography and Beyond", 7 pps., Mar. 31, 2014, DAC 14, <https://arxiv.org/pdf/1404.0321.pdf>.

*Primary Examiner* — Leigh M Garbowski
(74) *Attorney, Agent, or Firm* — Donald G. Weiss

(57) ABSTRACT

In an approach to integrated circuit track coloring, system ground rules, minimum wire width, minimum spacing, and a set of one or more colors, are received. A track layout is created. A first color is assigned to each power track. A second color is assigned to each wide track. One or more legal colors are determined for each minimum width track. A legal color is assigned to each minimum width track.

20 Claims, 9 Drawing Sheets

(56) References Cited

U.S. PATENT DOCUMENTS

| | | | |
|---|---|---|---|
| 10,430,546 B2 * | 10/2019 | Won | G06F 30/392 |
| 10,445,455 B2 * | 10/2019 | Do | G06F 30/392 |
| 2011/0014786 A1 | 1/2011 | Sezginer | |
| 2013/0205266 A1 | 8/2013 | Chen | |
| 2014/0007026 A1 | 1/2014 | Chen | |
| 2016/0147929 A1 | 5/2016 | Hoover | |

* cited by examiner

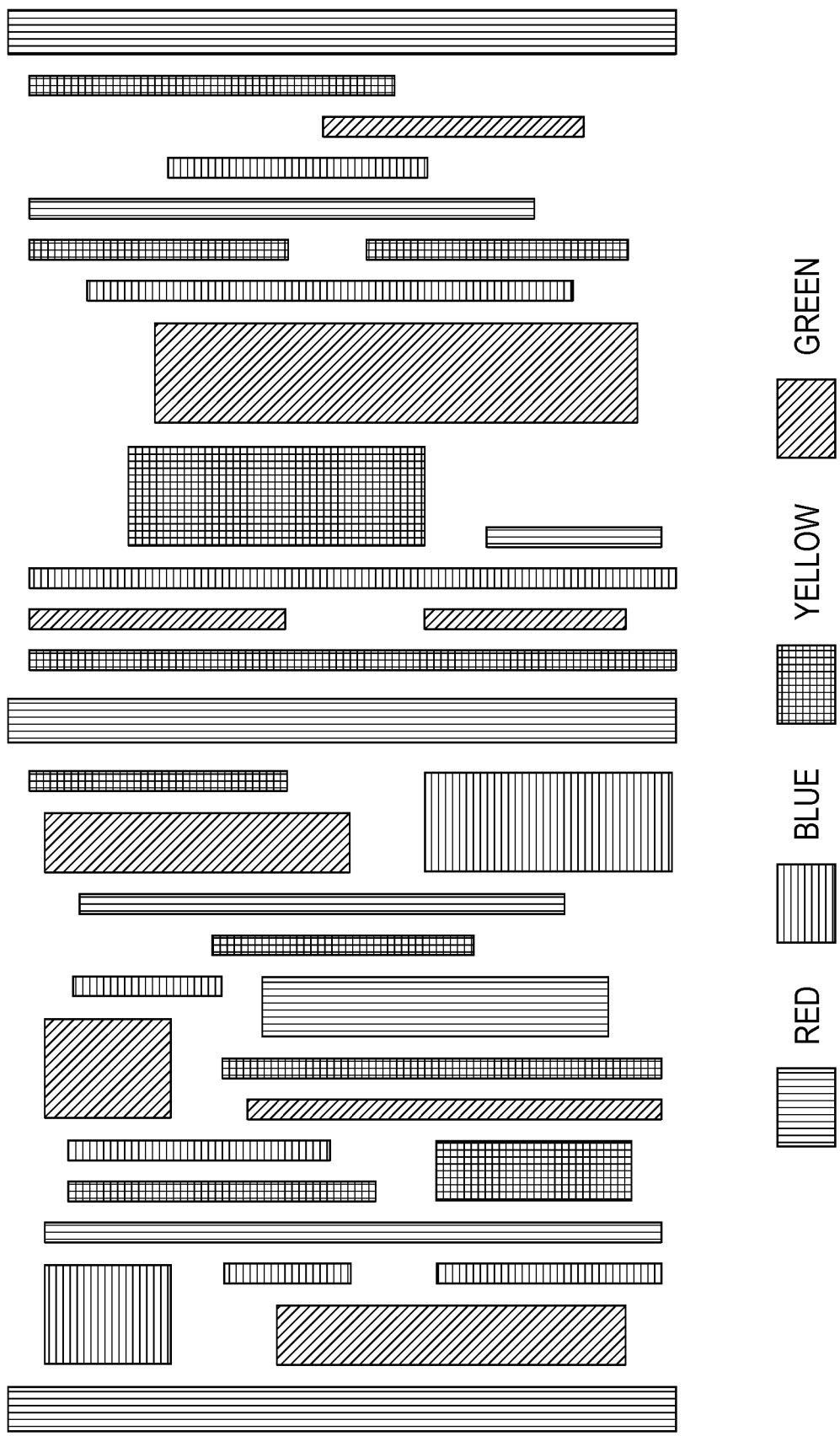

CONSTRUCTING COLORABLE WIRING LAYOUTS WITH WIDE WIRES AND SANDWICH RULES

BACKGROUND

The present invention relates generally to the field of data processing, and more particularly to integrated circuit track coloring for wide and narrow wire layouts.

Over recent decades, continuous reductions in the scale of field-effect transistors in accordance with Moore's law, which states that the number of transistors in an integrated circuit doubles every two years, have enabled continuous increases in device performance and transistor density. Currently, state-of-the-art devices are based on structural elements with dimensions of 7 nm or even 5 nm. The highest-resolution patterns required for these devices are silicon fins with a pitch of 18-28 nm and metal layers with a pitch of 24-32 nm. These dimensions far exceed the resolution attainable with today's single-exposure, 193 nm wavelength lithography.

To overcome the limitations of 193 nm wavelength lithography, multiple patterning methods—litho-etch or self-aligned multiple patterning—were used in the device miniaturization based on nodes of 10-28 nm. To achieve the specifications for 7 nm and 5 nm devices, a self-aligned quadruple patterning (SAQP) or four mask litho-etch (LELELELE) method may be used.

SUMMARY

Embodiments of the present invention disclose a method, a computer program product, and a system for constructing a colorable wiring layout. In one embodiment, system ground rules, minimum wire width, minimum spacing, and a set of one or more colors, are received. A track layout is created. A first color is assigned to each power track. A second color is assigned to each wide track. One or more legal colors are determined for each minimum width track. A legal color is assigned to each minimum width track.

BRIEF DESCRIPTION OF THE DRAWINGS

FIG. 4b depicts a sample screen of the wiring program after step 230 depicting an alternative sample routed layout freely mixing the track patterns created by the wiring program.

DETAILED DESCRIPTION

Figure 1:
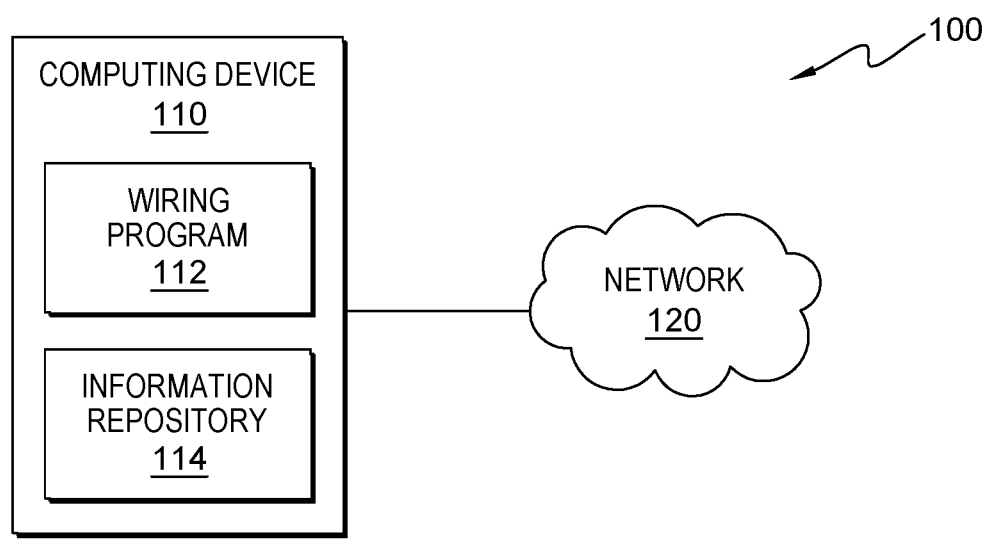
FIG. 1 is a functional block diagram illustrating a distributed data processing environment, in accordance with an embodiment of the present invention.

The design of state-of-the-art integrated circuits is currently based on structural elements with dimensions of 7 nm or even 5 nm. These dimensions far exceed the resolution attainable with today's single-exposure, 193 nm wavelength lithography. To overcome the limitations of 193 nm wavelength lithography, multiple patterning methods are used. Multiple patterning requires EDA software algorithms to automate the decomposition, or coloring, and checking of a layer. This technique requires multiple masks per layer. For example, quad multiple patterning requires 4 masks per layer, designated mask1 through mask4, which are also designated with a color, i.e., red, green, yellow, and blue, hence the term "coloring" for the process of decomposing the layer. The process of assigning a routing track to a mask is therefore referred to as "coloring" the track with the color corresponding to that particular mask (mask1 through mask4 for quad multiple patterning).

In addition, to avoid lithography errors, foundries introduce "sandwich rules," prohibiting thin wires surrounded by wide metal. Minimum width wires at minimum space are critical to design density, while wide wires are necessary for high performance. Integrated circuit designers typically need to mix wide and thin wires in an IC design. But sandwich rules restrict wire routing. In a multi-patterned wiring layer, coloring also impacts the sandwich rules; different color spacing typically only requires minimum spacing, while same color spacing typically requires larger spacing. Further requirements could be that same color wide wire spacing is greater than different color wide wire spacing. A system to automate the coloring process can potentially avoid these issues.

To ensure DRC correctness for color wide and narrow wire layout, colored track patterns and discrete wire widths are established such that no two wide wires of the same color, within a given distance as defined by the ground rules, may have a thin wire of the same color between them; in addition, no wide wire may have a same color wire within a given distance of the border of the wide wire. The router is thereby restricted to track patterns, where the tracks designate legal channels for wire routing; the router can mix and match thin and wide wires, ensured that they are color correct.

Embodiments of the present invention recognize that improvements can be made to integrated circuit colored wide and narrow wire layout design. Implementation of embodiments choose the power grid spacing based on the minimum width and spacing (pitch) of the layer, such that an odd number of minimum width wires fit between two power shapes. Based on the power grid spacing, the routing tracks between power tracks are established for minimum wire width tracks (1x), approximately three-times minimum wire width tracks (3x), and approximately five-times minimum wire width tracks (5x). After the power track colors are assigned, the 5x track colors are assigned. Next, the 3x track colors are assigned based on the 5x track assignment to ensure neither the sandwich rules nor the color rules can be violated by the router. Next, the 1x tracks are assigned by color based on the 5x track assignment and the 3x track assignment to ensure neither the sandwich rules nor the color rules can be violated. Finally, the colored track pattern between the power tracks is mirrored as necessary to create the final width-based colored track pattern for routing.

FIG. 1 is a functional block diagram illustrating a distributed data processing environment, generally designated 100, suitable for operation of wiring program 112 in accordance with at least one embodiment of the present invention. The term "distributed" as used herein describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes computing device 110 connected to network 120. Network 120 can be, for example, a telecommunications network, a local area network (LAN), a wide area network (WAN), such as the Internet, or a combination of the three, and can include wired, wireless, or fiber optic connections. Network 120 can include one or more wired and/or wireless networks that are capable of receiving and transmitting data, voice, and/or video signals, including multimedia signals that include voice, data, and video information. In general, network 120 can be any combination of connections and protocols that will support communications between computing device 110 and other computing devices (not shown) within distributed data processing environment 100.

Computing device 110 can be a standalone computing device, a management server, a web server, a mobile computing device, or any other electronic device or computing system capable of receiving, sending, and processing data. In other embodiments, computing device 110 can represent a server computing system utilizing multiple computers as a server system, such as in a cloud computing environment. In another embodiment, computing device 110 can be a laptop computer, a tablet computer, a netbook computer, a personal computer (PC), a desktop computer, a personal digital assistant (PDA), a smart phone, or any programmable electronic device capable of communicating with other computing devices (not shown) within distributed data processing environment 100 via network 120. In another embodiment, computing device 110 represents a computing system utilizing clustered computers and components (e.g., database server computers, application server computers, etc.) that act as a single pool of seamless resources when accessed within distributed data processing environment 100.

In an embodiment, computing device 110 includes wiring program 112. In an embodiment, wiring program 112 is a program, application, or subprogram of a larger program for creating integrated circuit wide and narrow width-based colored track patterns to ensure DRC correctness during routing. In an alternative embodiment, wiring program 112 may be located on any other device accessible by computing device 110 via network 120. In an embodiment, wiring program 112 creates integrated circuit 4-color wide and narrow width-based colored track patterns to ensure DRC correctness during routing. In another embodiment, wiring program 112 creates integrated circuit 3-color wide and narrow width-based colored track patterns to ensure DRC correctness during routing. In yet another embodiment, wiring program 112 creates integrated circuit wide and narrow width-based colored track patterns for any number of colors to ensure DRC correctness during routing.

In an embodiment, computing device 110 includes information repository 114. In an embodiment, information repository 114 may be managed by wiring program 112. In an alternative embodiment, information repository 114 may be managed by the operating system of the device, alone, or together with, wiring program 112. Information repository 114 is a data repository that can store, gather, compare, and/or combine information. In some embodiments, information repository 114 is located externally to computing device 110 and accessed through a communication network, such as network 120. In some embodiments, information repository 114 is stored on computing device 110. In some embodiments, information repository 114 may reside on another computing device (not shown), provided that information repository 114 is accessible by computing device 110. Information repository 114 includes, but is not limited to, layout data, wiring data, and other data that is received by wiring program 112 from one or more sources, and data that is created by wiring program 112.

Information repository 114 may be implemented using any volatile or non-volatile storage media for storing information, as known in the art. For example, information repository 114 may be implemented with a tape library, optical library, one or more independent hard disk drives, multiple hard disk drives in a redundant array of independent disks (RAID), solid-state drives (SSD), or random-access memory (RAM). Similarly, information repository 114 may be implemented with any suitable storage architecture known in the art, such as a relational database, an object-oriented database, or one or more tables.

Figure 2:
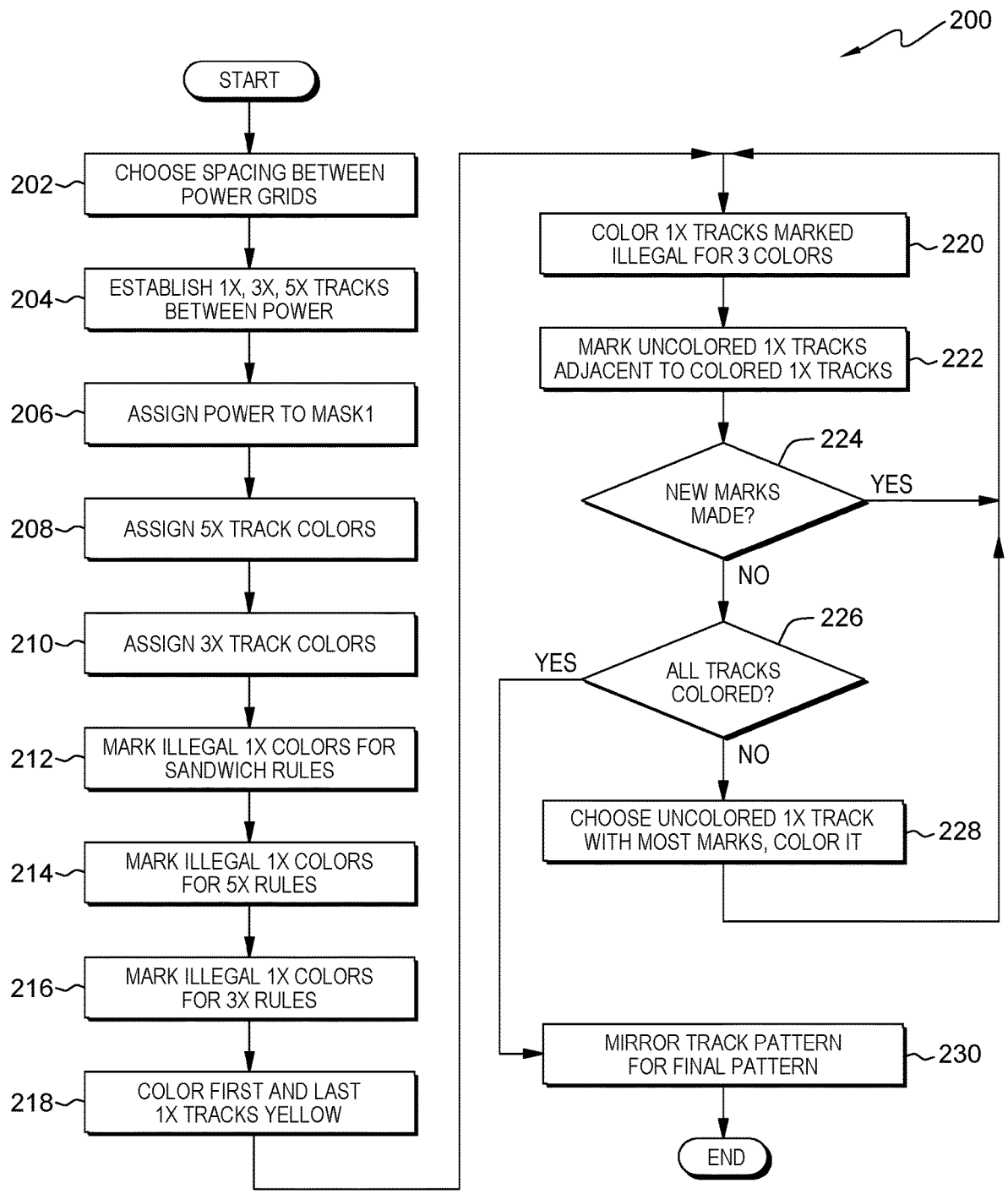
FIG. 2 is a flowchart depicting operational steps of the wiring program, on a computing device within the distributed data processing environment of FIG. 1, for creating integrated circuit wide and narrow colored track patterns to ensure DRC correctness during routing.

FIG. 2 is a flow chart diagram of workflow 200 depicting operational steps for wiring program 112 for constructing a colorable wiring layout in accordance with at least one embodiment of the invention. In an alternative embodiment, the steps of workflow 200 may be performed by any other program while working with wiring program 112. It should be appreciated that embodiments of the present invention provide at least for collecting data and input from computing device 110, and determining the optimum integrated circuit 4-color wide and narrow track patterns to ensure DRC correctness on computing device 110. However, FIG. 2 provides only an illustration of one implementation and does not imply any limitations with regard to the environments in which different embodiments may be implemented. Many modifications to the depicted environment may be made by those skilled in the art without departing from the scope of the invention as recited by the claims.

In an embodiment, wiring program 112 chooses the spacing between the power grids. In an embodiment, wiring program 112 establishes the $1x$, $3x$, and $5x$ tracks in the space between the power grids. In an embodiment, wiring program 112 assigns power to mask1. In an embodiment, wiring program 112 assigns track colors to the widest, i.e., $5x$, tracks. In an embodiment, wiring program 112 assigns track colors to the $3x$ tracks. In an embodiment, wiring program 112 marks illegal $1x$ track colors between wide tracks of the same color for sandwich rules. In an embodiment, wiring program 112 marks illegal $1x$ track colors in relation to colored $5x$ tracks for those $1x$ tracks that are not already marked illegal for that color. In an embodiment, wiring program 112 marks illegal $1x$ track colors for colored $3x$ tracks for those $1x$ tracks not already marked illegal for that color. In an embodiment, wiring program 112 colors the first and last $1x$ tracks yellow (for mask3). In an embodiment, wiring program 112 colors the $1x$ tracks that are marked illegal for three colors with the one remaining legal color. In an embodiment, wiring program 112 marks the uncolored $1x$ tracks that are adjacent to the $1x$ tracks colored in the previous step as illegal for the color of the adjacent track. In an embodiment, wiring program 112 determines if any $1x$ tracks were marked in steps 222. In an embodiment, wiring program 112 determines whether all tracks are now colored. In an embodiment, wiring program 112 chooses an uncolored 1x track that is marked illegal for the most colors and colors it. In an embodiment, wiring program 112 mirrors the track pattern as needed to create the final pattern.

Wiring program 112 chooses spacing (step 202). At step 202, wiring program 112 chooses the spacing between the power grids ("powerS"). In an embodiment, wiring program 112 chooses powerS using Equation 1. In this embodiment, wiring program 112 calculates powerS using the different color minimum spacing for the layer ("minS"), and the number of minimum width ("1x") tracks within the power bay ("n1x"), i.e., the space between two power tracks, where n1x is an odd number of tracks. In another embodiment, wiring program 112 chooses the spacing between the power grids using Equation 2. In this embodiment, wiring program 112 calculates the spacing between the power grids using tracks approximately three times the width of a 1x tracks within the power bay ("n3x"), and minS. In another embodiment, wiring program 112 chooses the spacing between the power grids using Equation 3. In this embodiment, wiring program 112 calculates the spacing between the power grids using tracks approximately five times the width of a 1x tracks within the power bay ("n5x"), where n5x is an odd number of tracks, and minS. In yet another embodiment, wiring program 112 calculates the spacing between the power grids using any combination of Equation 1, Equation 2, and Equation 3, and chooses the spacing that meets the requirements of all three equations.

$$powerS = n1x(1x + minS) + minS \quad \text{Equation 1}$$

$$powerS >= n3x(3x + minS) + minS \quad \text{Equation 2}$$

$$powerS >= n5x(5x + minS) + minS \quad \text{Equation 3}$$

Wiring program 112 establishes 1x, 3x, 5x tracks between power (step 204). At step 204, wiring program 112 establishes the 1x, 3x, and 5x tracks in the space between the power grids established in step 202. In an embodiment, wiring program 112 establishes the first 1x track centerline using Equation 4. In this embodiment, wiring program 112 calculates the first 1x track centerline, O, from the power grid width ("powerW"), which is approximately three times the minimum width of a wire for the layer ("minW"), and minS. In an embodiment, wiring program 112 calculates the remaining 1x track centerlines by repeatedly using Equation 5, t times, where t=n1x−1. For example, if wiring program 112 calculates that n1x is 15, then wiring program 112 repeats Equation 5 fourteen times (n1x is 15, therefore t=14) since the origin for the first 1x track was already established using Equation 4.

$$O = (\tfrac{1}{2} powerW + minS + \tfrac{1}{2} minW) \quad \text{Equation 4}$$

$$O + ((minS + minW) * t) \quad \text{Equation 5}$$

After wiring program 112 has determined the origins for all the 1x tracks, wiring program 112 then determines the origin for the 3x and 5x tracks. To determine the origin for the 3x tracks, wiring program 112 centers a 3x track over each pair of 1x tracks. If n1x is an odd number, wiring program 112 leaves a 1x gap at the end of the 3x track layout. To determine the origin for the 5x tracks, wiring program 112 centers a 5x track over each group of three 1x tracks. If n1x is not divisible by three, wiring program 112 leaves a 1x or 2x gap at the end of the 5x track layout.

Wiring program 112 assigns power to masks (step 206). In step 206, wiring program 112 assigns the power tracks to one or more specific masks based on the number of masks in the process. In an embodiment, the masks are color coded for 4-colors as follows: mask1 is colored red; mask2 is colored green; mask3 is colored yellow; and mask4 is colored blue. Assigning a track to a mask is referred to as coloring the track. In an embodiment with 4-colors, the power tracks are colored red for mask1. Since the sandwich rules are based upon separation from power, these power tracks are placed first, and all other tracks are placed relative to the power tracks. In another embodiment, the masks are colored for 3-colors as follows: mask1 is colored red; mask2 is colored green; and mask3 is colored yellow. In an embodiment with 3 colors, the initial power colors will alternate between red and green.

Wiring program 112 assigns 5x track colors (step 208). At step 208, wiring program 112 assigns track colors to the widest tracks. In an embodiment, wiring program 112 assigns every even numbered 5x track (i.e., the 2nd, 4th, 6th, etc., tracks) to mask3, the yellow mask. After all the even numbered 5x tracks have been colored, wiring program 112 assigns the remaining 5x tracks to masks. In an embodiment, wiring program 112 assigns alternate remaining 5x tracks (i.e., $1^{st}$, $3^{rd}$, $5^{th}$, $7^{th}$, etc., tracks) to mask4, the blue mask, and mask2, the green mask, such that the $1^{st}$, $5^{th}$, etc., 5x tracks are colored blue and the $3^{rd}$, $7^{th}$, etc., 5x tracks are colored green. This ensures that same color 5x tracks and same color power tracks are always properly separated.

Wiring program 112 assigns 3x track colors (step 210). At step 210, wiring program 112 assigns track colors to the 3x tracks. In an embodiment, wiring program 112 assigns 3x track colors in the sequence of mask2 (green), mask1 (red), and mask3 (yellow), until all the 3x tracks between the power tracks are colored.

Figure 3A:
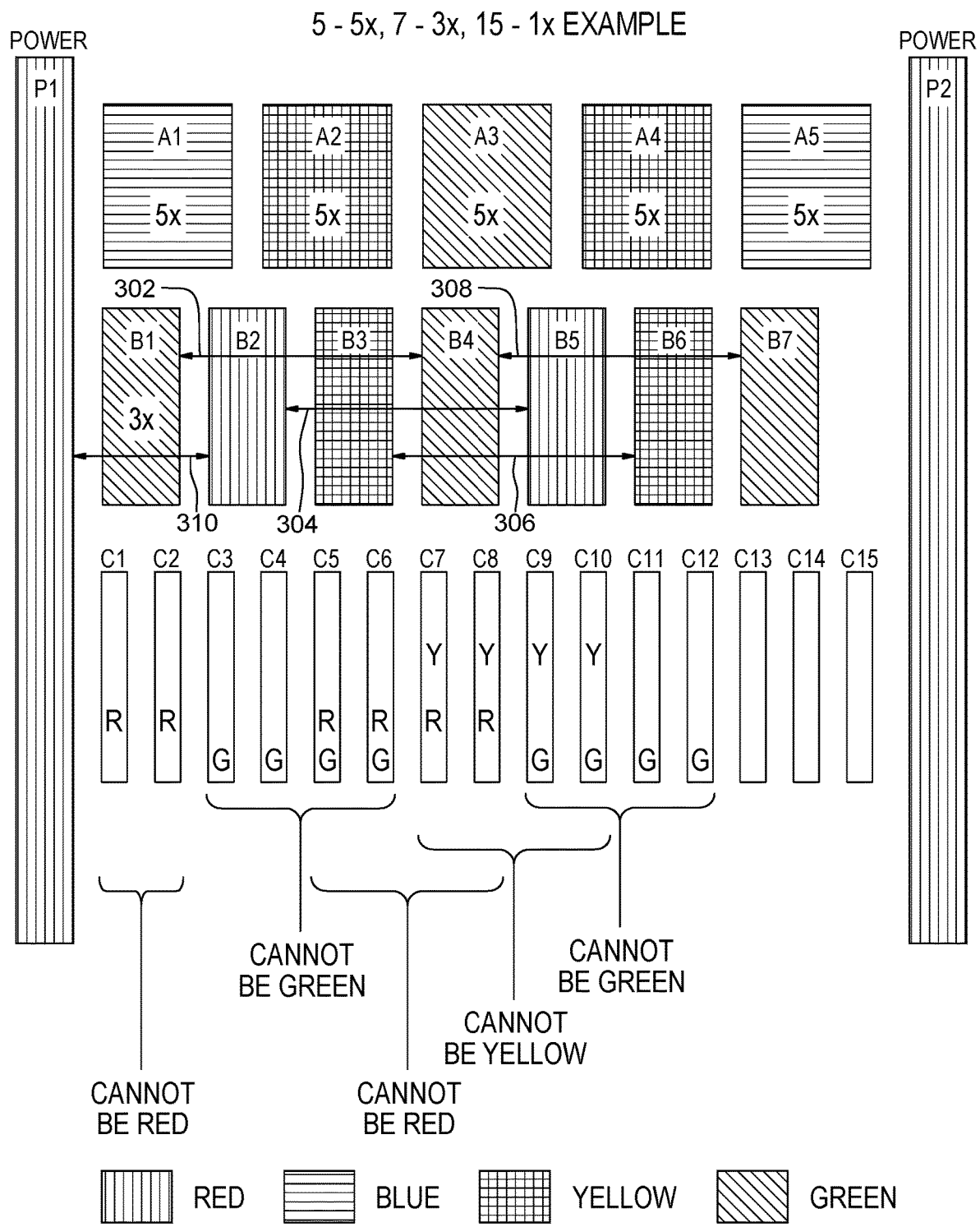
FIG. 3a depicts a sample screen of the wiring program at step 212.

Wiring program 112 marks illegal 1x track colors for sandwich rules (step 212). At step 212, wiring program 112 marks as illegal the 1x tracks between wide tracks of the same color for the sandwich rules. One sandwich rule states that two wide tracks (3x or above) cannot have a 1x track of the same color between them unless the gap is more than four 1x tracks. In an embodiment, wiring program 112 marks 1x tracks as illegal for a color when that 1x track is located between two 3x tracks of that same color which are four or fewer 1x tracks apart. FIG. 3a is a sample layout in progress by wiring program 112. In FIG. 3a, the 5x and 3x tracks have all been colored by wiring program 112. In step 212, wiring program 112 marks all 1x tracks with the colors that are illegal for that track according to the sandwich rules. In FIG. 3a, arrows 302, 304, 306, 308 and 310 illustrate the sandwich rule. In this example, arrow 302 illustrates that the gap between the green 3x track B1 and the green 3x track B4 is only four 1x tracks (tracks C3-C6), therefore wiring program 112 marks the four 1x tracks at positions C3-C6 illegal for green. Likewise, arrow 304 indicates that red tracks B2 and B5 have only four 1x tracks between them (C5-C8), therefore wiring program 112 marks tracks C5-C8 as illegal for red. Arrow 306 indicates that yellow tracks B3 and B6 have only four 1x tracks between them (C7-C10), therefore wiring program 112 marks tracks C7-C10 as illegal for yellow. Arrow 308 indicates that the gap between the green 3x tracks B4 and B7 is only four 1x tracks (C9-C12), therefore wiring program 112 marks the four 1x tracks at positions C9-C12 as illegal for green. Finally, arrow 310 indicates that red power track P1 and red track B2 have only two 1x tracks between them (C1-C2), therefore wiring program 112 marks tracks C1-C2 as illegal for red.

Figure 3B:
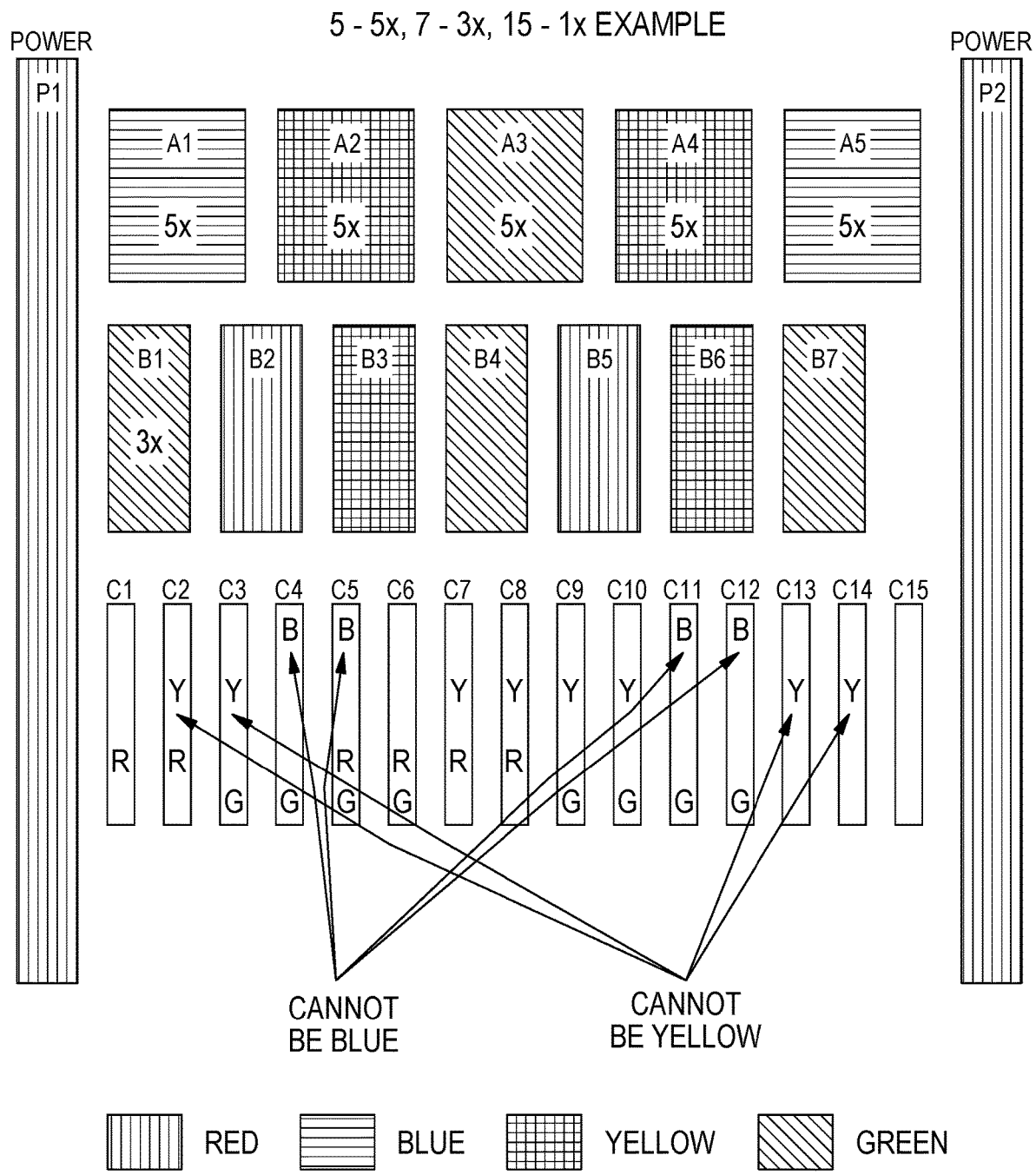
FIG. 3b depicts the sample screen of the wiring program at step 214.

Wiring program 112 marks illegal 1x track colors for 5x rules (step 214). At step 214, wiring program 112 marks illegal 1x track colors for 5x rules for those 1x tracks not already marked illegal for that color in step 212. In an embodiment, a rule requires that any 1x track must be separated from the border of a 5x track of the same color by more than two 1x tracks. In an embodiment, wiring program 112 marks all 1x tracks as illegal for a color that are within two 1x tracks of the border on either side of a 5x track of that same color. For example, FIG. 3b is a sample layout in progress by wiring program 112 at the completion of step 212. In FIG. 3b, 1x tracks that have not already been marked as illegal for a color, but are within two 1x tracks of the border of a 5x track of that same color, are marked illegal for that color. In FIG. 3b, tracks C4 and C5 are within two 1x tracks of the border of blue track A1, and are therefore marked as illegal for blue. Likewise, tracks C11 and C12 are within two 1x tracks of the border of blue track A5, and are therefore also marked as illegal for blue. Tracks C2 and C3 are within two 1x tracks of the border of yellow track A2, and are therefore marked as illegal for yellow, as are tracks C13 and C14, since they are within two 1x tracks of the border of yellow track A4.

Figure 3C:
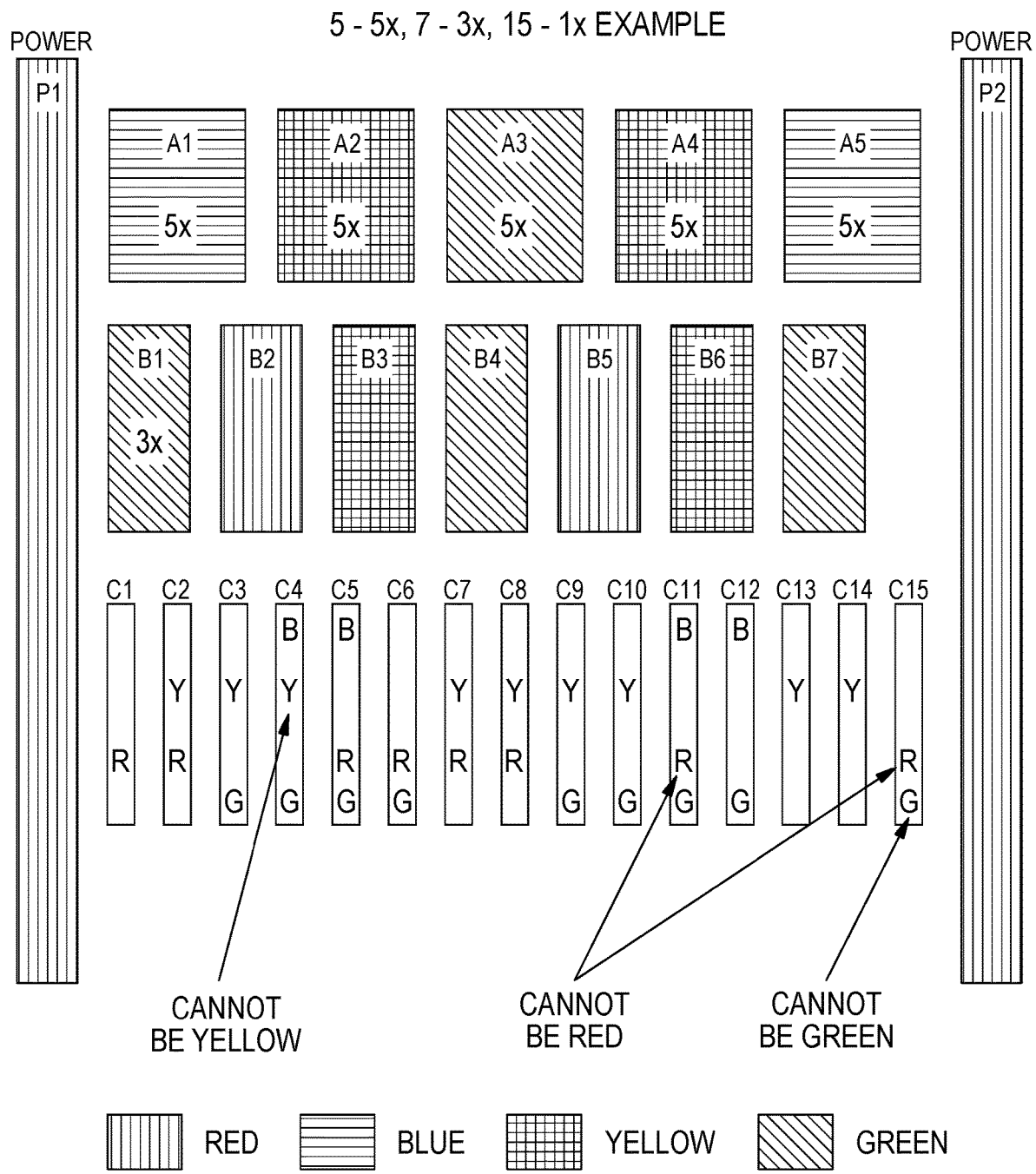
FIG. 3c depicts a sample screen of the wiring program at step 216.

Wiring program 112 marks illegal 1x track colors for 3x rules (step 216). At step 216, wiring program 112 marks illegal 1x track colors for 3x rules for those 1x tracks not already marked illegal for that color in step 212 or 214. In an embodiment, a rule requires that a 1x track must not be adjacent to the border of a 3x track of the same color. In an embodiment, wiring program 112 marks as illegal for a color all 1x tracks that are adjacent to the border of a 3x track of that color. For example, FIG. 3c is a sample layout in progress by wiring program 112 at the completion of step 214. In FIG. 3c, wiring program 112 marks as illegal for a color 1x tracks that have not already been marked as illegal for that color, but are adjacent to the border of a 3x track of that color. In FIG. 3c, track C4 is adjacent to the border of yellow track B3, and is therefore marked as illegal for yellow. Likewise, track C11 is adjacent to the border of red track B5, and is therefore marked as illegal for red. Track C15 is adjacent to the border of the red power track, and is therefore marked as illegal for red. Track C15 is also adjacent to the border of green track B7, and is therefore marked as illegal for green.

Wiring program 112 colors the first and last 1x tracks (step 218). At step 218, to start coloring the 1x tracks, wiring program 112 colors the first and last 1x tracks based on the number of colors in the design. In an embodiment using 4-colors, wiring program 112 colors the first and last 1x tracks yellow (for mask3).

Wiring program 112 colors the 1x tracks marked illegal for three colors (step 220). Wiring program 112 colors the 1x tracks that are marked illegal for three colors with the one remaining legal color. For example, in FIG. 3c, tracks C4, C5, and C11 are marked as illegal for three colors (blue, yellow, and green for track C4; blue, red, and green for tracks C5 and C11). Therefore, wiring program 112 colors track C4 as red, the only remaining legal color for track C4, and colors tracks C5 and C11 as yellow, the only remaining legal color for tracks C5 and C11.

Wiring program 112 marks uncolored 1x tracks adjacent to colored 1x tracks (step 222). Wiring program 112 marks the uncolored 1x tracks that are adjacent to the 1x tracks colored in step 220, as illegal for the color that the adjacent track was colored in step 220. For example, in step 220, wiring program 112 colored track C4 (from FIG. 3c) as red; therefore, wiring program 112 marks track C3 as illegal for red, since it is adjacent to track C4. In this example, the other 1x track adjacent to track C4, track C5, was already colored yellow by wiring program 112 in step 220; therefore, track C5 is not marked as illegal for red. Similarly, track C6 is adjacent to track C5, which wiring program 112 colored yellow in step 220; therefore, wiring program 112 marks track C6 as illegal for yellow. Finally, wiring program 112 colored track C11 yellow in step 220; therefore, wiring program 112 marks adjacent track C12 as illegal for yellow. Uncolored track C10 is also adjacent to now yellow track C11, but wiring program 112 already marked track C10 as illegal for yellow in step 212.

Wiring program 112 determines if new marks were made (step 224) At step 224, wiring program 112 determines if any 1x tracks were marked in step 222. If no additional 1x tracks were marked as illegal for any color in step 222, then wiring program 112 proceeds to step 226. If any 1x tracks were marked as illegal for any color in step 222, then it is possible that the 1x tracks that were marked as illegal for any color in step 222 are now marked illegal for three colors. Therefore, if any 1x tracks were marked as illegal for any color in step 222, wiring program 112 returns to step 220.

Wiring program 112 determines if all tracks are colored (step 226). At step 226, wiring program 112 determines whether all tracks are now colored. If wiring program 112 determines that all tracks have been colored, then wiring program 112 proceeds to step 230. If wiring program 112 determines that not all tracks have been colored, then wiring program 112 proceeds to step 228.

Wiring program 112 chooses an uncolored 1x track with the most marks and colors it (step 228). At step 228, wiring program 112 chooses an uncolored 1x track that is marked illegal for the most colors and colors it. In an embodiment, wiring program 112 analyzes the remaining uncolored 1x tracks to determine which remaining uncolored 1x tracks are marked illegal for the most colors. If only one 1x track is marked illegal for the most colors, wiring program 112 colors that track. If more than one 1x track is marked illegal for the most colors, wiring program 112 chooses one 1x track that is marked illegal for the most colors and colors that track. In an embodiment, wiring program 112 chooses one 1x track that is marked illegal for the most colors by choosing the first 1x track that is marked illegal for the most colors. In another embodiment, wiring program 112 chooses one 1x track that is marked illegal for the most colors by analyzing the number of marks on the 1x tracks adjacent to each of the 1x tracks that are marked illegal for the most colors and choosing the one 1x track that is adjacent to the 1x track marked as illegal for the most colors. If more than one 1x track is adjacent to a 1x track that is marked illegal for the most colors, wiring program 112 chooses the first such 1x track.

In an embodiment, if the one 1x track that is marked illegal for the most colors is marked illegal for less than three colors, then wiring program 112 chooses the color for the 1x track that is marked illegal for the most colors by choosing the color that is assigned to another 1x track furthest from the chosen track. In another embodiment, wiring program 112 chooses the color for the 1x track that is marked illegal for the most colors by analyzing the number of 1x tracks already assigned to each color, and coloring the 1x track that is marked illegal for the most colors with the color that has the fewest 1x tracks already colored that color. In yet another embodiment, wiring program 112 receives a predetermined preferential color, and colors the 1x track that is marked illegal for the most colors with the predetermined preferential color.

Upon completion of step 228, wiring program 112 returns to step 220.

Wiring program 112 mirrors the track pattern to create the final pattern (step 230). At step 230, wiring program 112 mirrors the track pattern between the power grids as needed to create the final pattern. In an embodiment, wiring program 112 mirrors the track pattern between the power grids as many times as required until the entire routing area of the layer is assigned colored tracks to create the final routing track patterns.

Figure 4A:
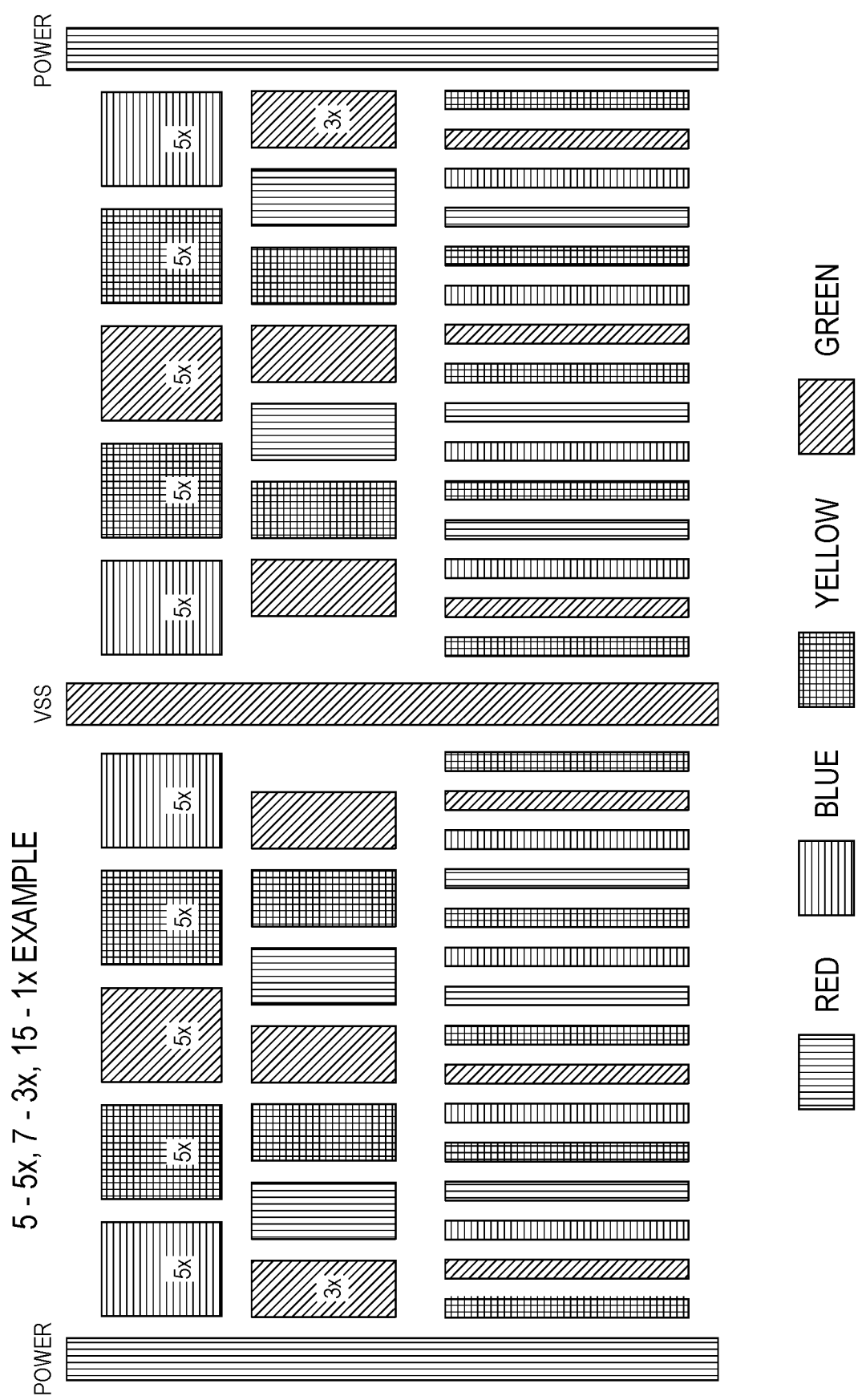
FIG. 4a depicts a sample screen of the wiring program after step 230.

FIG. 4a represents a sample of the final routing colored track patterns at the completion of step 230. In FIG. 4a, all 1x tracks have been colored such that no 1x track is between two 5x tracks of the same color that are separated by four or few 1x tracks (sandwich rules), no 1x track is within two 1x tracks of the border of a 5x track of the same color, and no 1x track is adjacent to the border of a 3x track of the same color. In addition, the tracks to the right of the VSS track have been mirrored from the layout of the tracks to the left of the VSS track.

FIG. 4b represents a sample of the final routing colored track patterns resulting from the usage of the width-based colored track patterns of FIG. 4a. In FIG. 4b, the various width tracks (1x, 3x, and 5x) have been utilized for actual wiring requirements based on the patterns created by wiring program 112.

Figure 5:
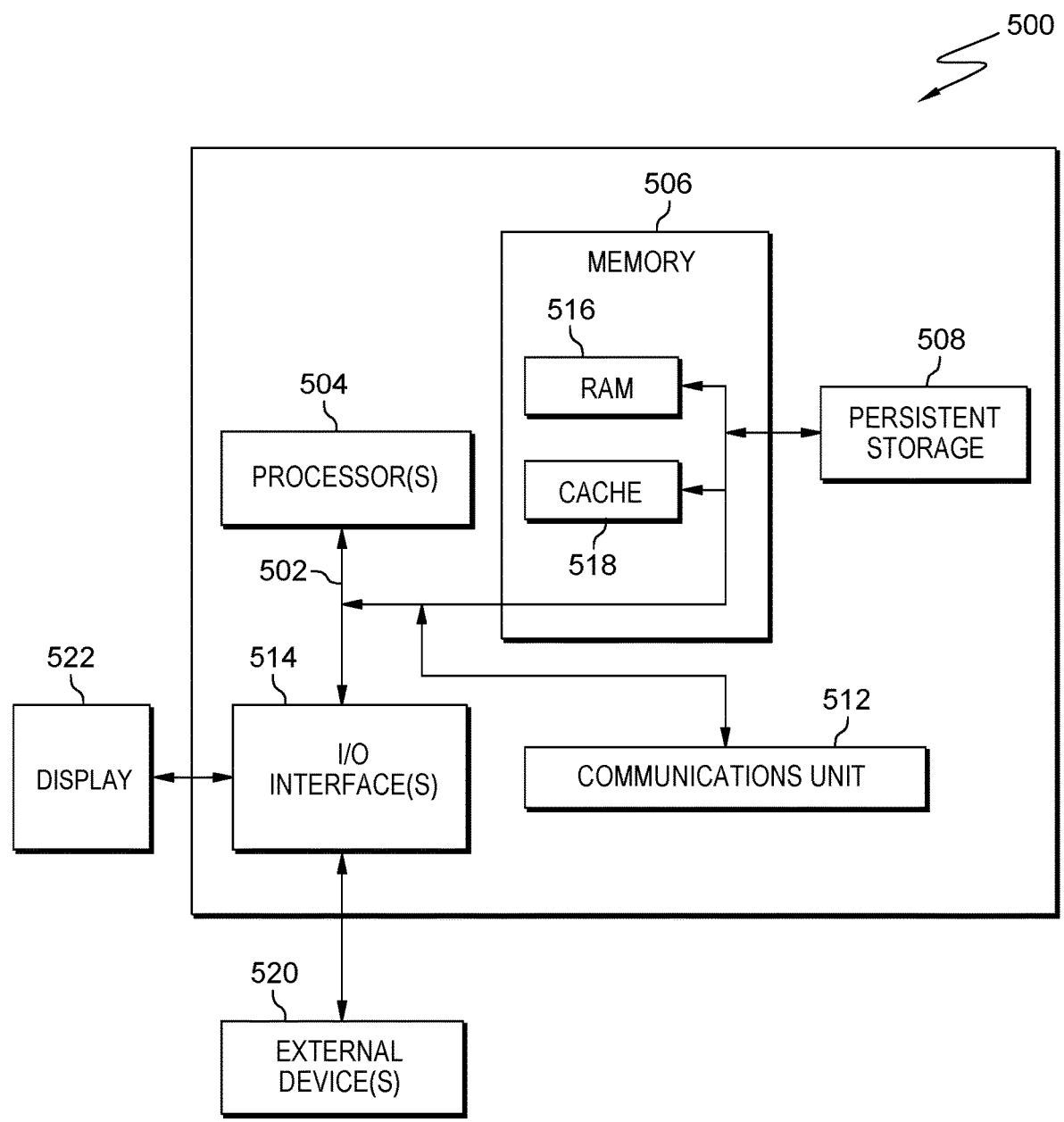
FIG. 5 depicts a block diagram of components of the computing devices executing the wiring program within the distributed data processing environment of FIG. 1, in accordance with an embodiment of the present invention.

FIG. 5 is a block diagram depicting components of computing device 110 suitable for wiring program 112, in accordance with at least one embodiment of the invention. FIG. 5 displays the computer 500, one or more processor(s) 504 (including one or more computer processors), a communications fabric 502, a memory 506 including, a random-access memory (RAM) 516, and a cache 518, a persistent storage 508, a communications unit 512, I/O interfaces 514, a display 522, and external devices 520. It should be appreciated that FIG. 5 provides only an illustration of one embodiment and does not imply any limitations with regard to the environments in which different embodiments may be implemented. Many modifications to the depicted environment may be made.

As depicted, the computer 500 operates over the communications fabric 502, which provides communications between the computer processor(s) 504, memory 506, persistent storage 508, communications unit 512, and input/output (I/O) interface(s) 514. The communications fabric 502 may be implemented with an architecture suitable for passing data or control information between the processors 504 (e.g., microprocessors, communications processors, and network processors), the memory 506, the external devices 520, and any other hardware components within a system. For example, the communications fabric 502 may be implemented with one or more buses.

The memory 506 and persistent storage 508 are computer readable storage media. In the depicted embodiment, the memory 506 comprises a RAM 516 and a cache 518. In general, the memory 506 can include any suitable volatile or non-volatile computer readable storage media. Cache 518 is a fast memory that enhances the performance of processor(s) 504 by holding recently accessed data, and data near recently accessed data, from RAM 516.

Program instructions for wiring program 112 may be stored in the persistent storage 508, or more generally, any computer readable storage media, for execution by one or more of the respective computer processors 504 via one or more memories of the memory 506. The persistent storage 508 may be a magnetic hard disk drive, a solid-state disk drive, a semiconductor storage device, read only memory (ROM), electronically erasable programmable read-only memory (EEPROM), flash memory, or any other computer readable storage media that is capable of storing program instruction or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

The communications unit 512, in these examples, provides for communications with other data processing systems or devices. In these examples, the communications unit 512 includes one or more network interface cards. The communications unit 512 may provide communications through the use of either or both physical and wireless communications links. In the context of some embodiments of the present invention, the source of the various input data may be physically remote to the computer 500 such that the input data may be received, and the output similarly transmitted via the communications unit 512.

The I/O interface(s) 514 allows for input and output of data with other devices that may be connected to computer 500. For example, the I/O interface(s) 514 may provide a connection to external device(s) 520 such as a keyboard, a keypad, a touch screen, a microphone, a digital camera, and/or some other suitable input device. External device(s) 520 can also include portable computer readable storage media such as, for example, thumb drives, portable optical or magnetic disks, and memory cards. Software and data used to practice embodiments of the present invention, e.g., wiring program 112, can be stored on such portable computer readable storage media and can be loaded onto persistent storage 508 via the I/O interface(s) 514. I/O interface(s) 514 also connect to a display 522.

Display 522 provides a mechanism to display data to a user and may be, for example, a computer monitor. Display 522 can also function as a touchscreen, such as a display of a tablet computer.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Figure 6:
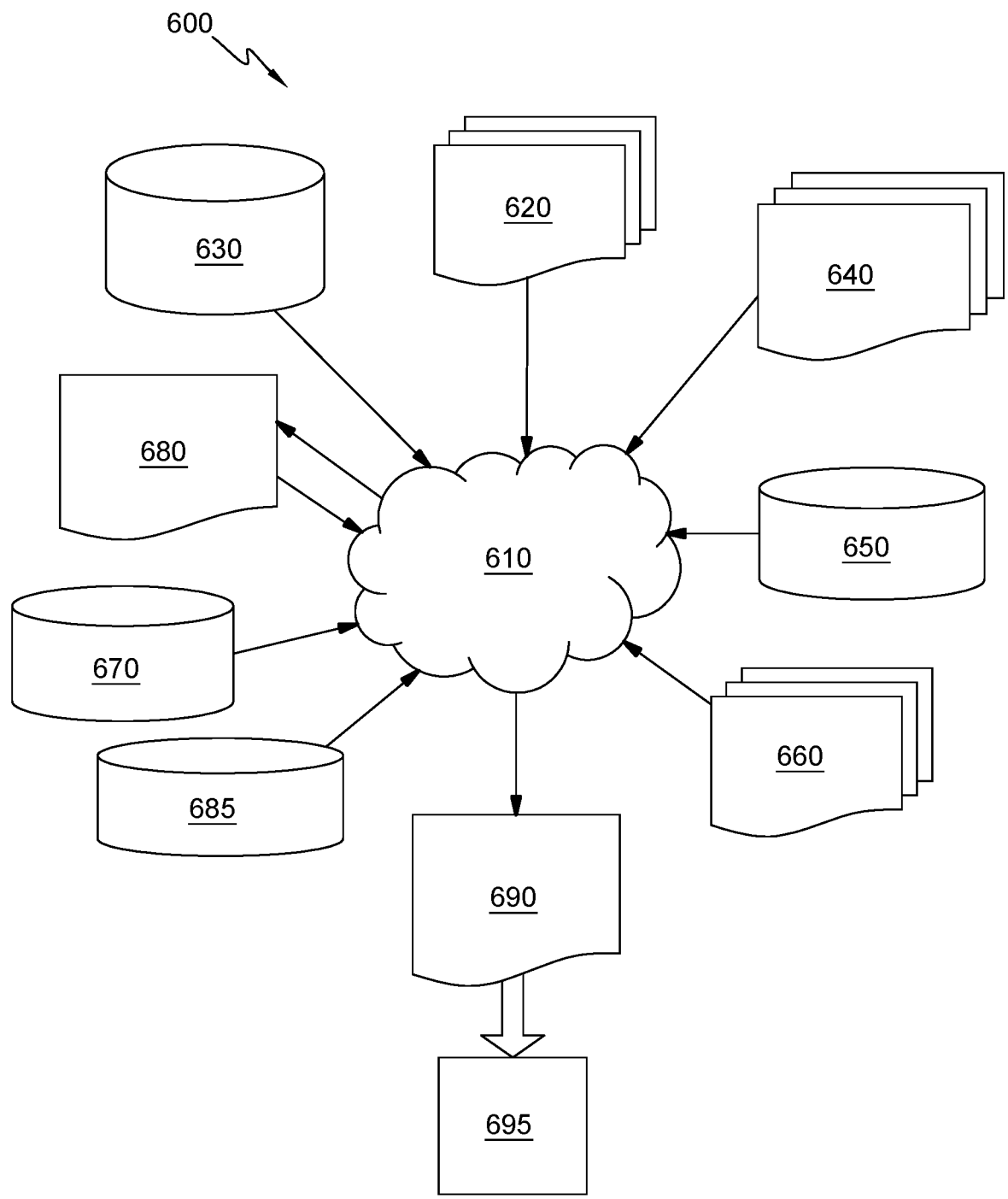
FIG. 6 depicts a flow diagram of a design process used in semiconductor design, manufacture, and/or test.

One or more embodiments integrate the colorable wiring layout techniques herein with semiconductor integrated circuit design, simulation, test, layout, and/or manufacture. In this regard, FIG. 6 shows a block diagram of an exemplary design flow 600 used, for example, in semiconductor IC logic design, simulation, test, layout, and manufacture. Design flow 600 includes processes, machines and/or mechanisms for processing design structures or devices to generate logically or otherwise functionally equivalent representations of design structures and/or devices, such as those that can be routed using colorable wiring layouts or the like. The design structures processed and/or generated by design flow 600 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: computers or equipment for IC routing, lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a gate array or storage medium or the like, design structure 620 may be accessed and processed by one or more hardware and/or software modules within design process 610 to simulate or otherwise functionally represent an electronic component, circuit, electronic or logic module, apparatus, device, or system. As such, design structure 620 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 610 preferably employs and incorporates hardware and/or software modules for synthesizing, translating, or otherwise processing a design/simulation functional equivalent of components, circuits, devices, or logic structures to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685, which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc. Improved placement can be performed as described herein.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 690 may comprise a compiled, executable HDL simulation model that functionally simulates the devices to be analyzed.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 690 may then proceed to a stage 695 where, for example, design structure 690: proceeds to tape-out; is released to manufacturing; is released to a mask house; is sent to another design house is sent back to the customer; etc.

What is claimed is:

1. A computer-implemented method for constructing a colorable wiring layout, the computer-implemented method comprising the steps of:
receiving, by one or more computer processors, a system ground rules, a minimum wire width, a minimum spacing, and a set of one or more colors, wherein each color of the set of one or more colors represents a mask;
creating, by one or more computer processors, a track layout, wherein the track layout includes a two power tracks, a one or more $1x$ tracks, and a one or more wide tracks, wherein the width of the one or more $1x$ tracks is the minimum wire width;
assigning, by one or more computer processors, any first color of the set of one or more colors to each power track of the two power tracks, wherein the any first color may be different for each power track;
assigning, by one or more computer processors, any second color of the set of one or more colors to each wide track of the one or more wide tracks, wherein the any second color may be different for each wide track;
determining, by one or more computer processors, one or more third colors of the set of one or more colors for each $1x$ track of the one or more $1x$ tracks, wherein the one or more third colors are legal for the each $1x$ track based on the system ground rules; and
assigning, by one or more computer processors, a fourth color of the one or more third colors to the each $1x$ track of the one or more $1x$ tracks, based on the determination of the one or more third colors that are legal for the each $1x$ track.

2. The computer-implemented method of claim 1, wherein creating, by one or more computer processors, a track layout, wherein the track layout includes a two power tracks, a one or more $1x$ tracks, and a one or more wide tracks comprises:
calculating, by one or more computer processors, a spacing between the two power tracks based on the system ground rules, the minimum wire width, and the minimum spacing, wherein an odd number of the one or more $1x$ tracks fit between the two power tracks;
placing, by one or more computer processors, the one or more $1x$ tracks between the two power tracks based on the spacing between the two power tracks;
placing, by one or more computer processors, a one or more $3x$ tracks between the two power tracks based on the spacing between the two power tracks, wherein the one or more $3x$ tracks are wide tracks of the one or more wide tracks, having a $3x$ width that is three times the minimum wire width, and wherein each $3x$ track is centered above two adjacent $1x$ tracks of the one or more $1x$ tracks; and
placing, by one or more computer processors, a one or more $5x$ tracks between the two power tracks based on the spacing between the two power tracks, wherein the one or more $5x$ tracks are wide tracks of the one or more wide tracks, having a $5x$ width that is five times the minimum wire width, and wherein each $5x$ track is centered above three adjacent $1x$ tracks of the one or more $1x$ tracks.

3. The computer-implemented method of claim 2, wherein the $3x$ width is about three times the minimum wire width; and wherein the $5x$ width is about five times the minimum wire width.

4. The computer-implemented method of claim 2, wherein the $3x$ width is greater than the minimum wire width but no more than three times the minimum wire width; and wherein the $5x$ width is more than three times the minimum wire width but no more than five times the minimum wire width.

5. The computer-implemented method of claim 1, wherein assigning, by one or more computer processors, any second color of the set of one or more colors to each wide track of the one or more wide tracks, wherein the any second color may be different for each wide track comprises:
assigning, by one or more computer processors, a mask3 color of the set of one or more colors to every even numbered $5x$ track of the one or more $5x$ tracks, wherein the one or more $5x$ tracks are wide tracks of the one or more wide tracks, and wherein the $5x$ width is five times the minimum wire width;
assigning, by one or more computer processors, a mask4 color of the set of one or more colors to every second odd numbered $5x$ track of the one or more $5x$ tracks, starting with the first odd numbered $5x$ track;
assigning, by one or more computer processors, a mask2 color of the set of one or more colors to every second odd numbered $5x$ track of the one or more $5x$ tracks, starting with the second odd numbered $5x$ track; and
assigning, by one or more computer processors, the mask2 color of the set of one or more colors, a mask1 color of the set of one or more colors, and the mask3 color of the set of one or more colors to the $3x$ tracks of the one or more $3x$ tracks, wherein the assignment repeats the sequence of mask2 color, mask1 color, and mask3 color, and wherein the one or more $3x$ tracks are wide tracks of the one or more wide tracks, and wherein the $3x$ width is three times the minimum wire width.

6. The computer-implemented method of claim 1, wherein determining, by one or more computer processors, one or more third colors of the set of one or more colors for each $1x$ track of the one or more $1x$ tracks, wherein the one or more third colors are legal for the each $1x$ track based on the system ground rules comprises:
marking, by one or more computer processors, as illegal for a $3x$ color of the set of one or more colors, any $1x$ tracks of the each $1x$ track of the one or more $1x$ tracks that are located between two $3x$ tracks of the one or more $3x$ tracks that are both colored the $3x$ color, wherein there are four or fewer $1x$ tracks between the two $3x$ tracks, and wherein the one or more $3x$ tracks are wide tracks of the one or more wide tracks, and wherein the $3x$ width is three times the minimum wire width;
marking, by one or more computer processors, as illegal for a $5x$ color of the set of one or more colors, any $1x$ tracks of the each $1x$ track of the one or more $1x$ tracks that are located within two $1x$ tracks of a border of a $5x$ track of the one or more $5x$ tracks that is colored the $5x$ color, wherein the one or more $5x$ tracks are wide tracks of the one or more wide tracks, and wherein the $5x$ width is five times the minimum wire width; and
marking, by one or more computer processors, as illegal for a fifth color of the set of one or more colors, any $1x$ tracks of the each $1x$ track of the one or more $1x$ tracks that are adjacent to the border of a $3x$ track of the one or more $3x$ tracks that is colored the fifth color.

7. The computer-implemented method of claim 1, wherein assigning, by one or more computer processors, a fourth color of the one or more third colors to the each $1x$ track of the one or more 1x tracks, based on the determination of the one or more third colors that are legal for the each 1x track comprises:

assigning, by one or more computer processors, a sixth color of the one or more third colors to the each 1x track of the one or more 1x tracks that are adjacent to each power track of the two power tracks, wherein the sixth color is a different color than the color of the adjacent power track;

assigning, by one or more computer processors, a seventh color of the one or more third colors to the each 1x track of the one or more 1x tracks marked as illegal for all colors of the set of one or more colors except the seventh color;

marking, by one or more computer processors, as illegal for the seventh color of the one or more third colors, any 1x tracks of the each 1x track of the one or more 1x tracks that are adjacent to the each 1x track of the one or more 1x tracks marked as illegal for all colors of the set of one or more colors except the seventh color;

choosing, by one or more computer processors, any 1x tracks of the each 1x track of the one or more 1x tracks that are marked as illegal for all colors of the one or more third colors except a two eighth colors of the one or more third colors;

assigning, by one or more computer processors, any one of the two eighth colors of the one or more third colors to the any 1x tracks of the each 1x track of the one or more 1x tracks that are marked as illegal for all colors of the one or more third colors except the two eighth colors, wherein the any one of the two eighth colors is a different color than the color of the 1x tracks of the one or more 1x tracks that are adjacent to the any 1x tracks of the one or more 1x tracks marked as illegal for all colors except the two eighth colors of the one or more third colors; and assigning, by one or more computer processors, a ninth color of the one or more third colors to any remaining uncolored 1x tracks of the each 1x track of the one or more 1x tracks, wherein the ninth color is a different color than the color of the 1x tracks of the one or more 1x tracks that are adjacent to the any remaining uncolored 1x tracks of the each 1x track of the one or more 1x tracks.

8. A computer program product for constructing a colorable wiring layout, the computer program product comprising:

one or more computer readable storage device and program instructions stored on the one or more computer readable storage device, the stored program instructions comprising:

program instructions to receive a system ground rules, a minimum wire width, a minimum spacing, and a set of one or more colors, wherein each color of the set of one or more colors represents a mask;

program instructions to create a track layout, wherein the track layout includes a two power tracks, a one or more 1x tracks, and a one or more wide tracks, wherein the width of the one or more 1x tracks is the minimum wire width;

program instructions to assign any first color of the set of one or more colors to each power track of the two power tracks, wherein the any first color may be different for each power track;

program instructions to assign any second color of the set of one or more colors to each wide track of the one or more wide tracks, wherein the any second color may be different for each wide track;

program instructions to determine one or more third colors of the set of one or more colors for each 1x track of the one or more 1x tracks, wherein the one or more third colors are legal for the each 1x track based on the system ground rules; and program instructions to assign a fourth color of the one or more third colors to the each 1x track of the one or more 1x tracks, based on the determination of the one or more third colors that are legal for the each 1x track.

9. The computer program product of claim 8, wherein program instructions to create a track layout, wherein the track layout includes a two power tracks, a one or more 1x tracks, and a one or more wide tracks comprises:

program instructions to calculate a spacing between the two power tracks based on the system ground rules, the minimum wire width, and the minimum spacing, wherein an odd number of the one or more 1x tracks fit between the two power tracks;

program instructions to place the one or more 1x tracks between the two power tracks based on the spacing between the two power tracks;

program instructions to place a one or more 3x tracks between the two power tracks based on the spacing between the two power tracks, wherein the one or more 3x tracks are wide tracks of the one or more wide tracks, having a 3x width that is three times the minimum wire width, and wherein each 3x track is centered above two adjacent 1x tracks of the one or more 1x tracks; and program instructions to place a one or more 5x tracks between the two power tracks based on the spacing between the two power tracks, wherein the one or more 5x tracks are wide tracks of the one or more wide tracks, having a 5x width that is five times the minimum wire width, and wherein each 5x track is centered above three adjacent 1x tracks of the one or more 1x tracks.

10. The computer program product of claim 9, wherein the 3x width is about three times the minimum wire width; and wherein the 5x width is about five times the minimum wire width.

11. The computer program product of claim 9, wherein the 3x width is greater than the minimum wire width but no more than three times the minimum wire width; and wherein the 5x width is more than three times the minimum wire width but no more than five times the minimum wire width.

12. The computer program product of claim 8, wherein program instructions to assign any second color of the set of one or more colors to each wide track of the one or more wide tracks, wherein the any second color may be different for each wide track comprises:

program instructions to assign a mask3 color of the set of one or more colors to every even numbered 5x track of the one or more 5x tracks, wherein the one or more 5x tracks are wide tracks of the one or more wide tracks, and wherein the 5x width is five times the minimum wire width;

program instructions to assign a mask4 color of the set of one or more colors to every second odd numbered 5x track of the one or more 5x tracks, starting with the first odd numbered 5x track;

program instructions to assign a mask2 color of the set of one or more colors to every second odd numbered 5x track of the one or more 5x tracks, starting with the second odd numbered 5x track; and program instructions to assign the mask2 color of the set of one or more colors, a mask1 color of the set of one or more colors, and the mask3 color of the set of one or more colors to the $3x$ tracks of the one or more $3x$ tracks, wherein the assignment repeats the sequence of mask2 color, mask1 color, and mask3 color, and wherein the one or more $3x$ tracks are wide tracks of the one or more wide tracks, and wherein the $3x$ width is three times the minimum wire width.

13. The computer program product of claim 8, wherein program instructions to determine one or more third colors of the set of one or more colors for each $1x$ track of the one or more $1x$ tracks, wherein the one or more third colors are legal for the each $1x$ track based on the system ground rules comprises:

program instructions to mark as illegal for a $3x$ color of the set of one or more colors, any $1x$ tracks of the each $1x$ track of the one or more $1x$ tracks that are located between two $3x$ tracks of the one or more $3x$ tracks that are both colored the $3x$ color, wherein there are four or fewer $1x$ tracks between the two $3x$ tracks, and wherein the one or more $3x$ tracks are wide tracks of the one or more wide tracks, and wherein the $3x$ width is three times the minimum wire width;

program instructions to mark as illegal for a $5x$ color of the set of one or more colors, any $1x$ tracks of the each $1x$ track of the one or more $1x$ tracks that are located within two $1x$ tracks of a border of a $5x$ track of the one or more $5x$ tracks that is colored the $5x$ color, wherein the one or more $5x$ tracks are wide tracks of the one or more wide tracks, and wherein the $5x$ width is five times the minimum wire width; and program instructions to mark as illegal for a fifth color of the set of one or more colors, any $1x$ tracks of the each $1x$ track of the one or more $1x$ tracks that are adjacent to the border of a $3x$ track of the one or more $3x$ tracks that is colored the fifth color.

14. The computer program product of claim 8, wherein assigning, by one or more computer processors, a fourth color of the one or more third colors to the each $1x$ track of the one or more $1x$ tracks, based on the determination of the one or more third colors that are legal for the each $1x$ track comprises:

program instructions to assign a sixth color of the one or more third colors to the each $1x$ track of the one or more $1x$ tracks that are adjacent to each power track of the two power tracks, wherein the sixth color is a different color than the color of the adjacent power track;

program instructions to assign a seventh color of the one or more third colors to the each $1x$ track of the one or more $1x$ tracks marked as illegal for all colors of the set of one or more colors except the seventh color;

program instructions to mark as illegal for the seventh color of the one or more third colors, any $1x$ tracks of the each $1x$ track of the one or more $1x$ tracks that are adjacent to the each $1x$ track of the one or more $1x$ tracks marked as illegal for all colors of the set of one or more colors except the seventh color;

program instructions to choose any $1x$ tracks of the each $1x$ track of the one or more $1x$ tracks that are marked as illegal for all colors of the one or more third colors except a two eighth colors of the one or more third colors;

program instructions to assign any one of the two eighth colors of the one or more third colors to the any $1x$ tracks of the each $1x$ track of the one or more $1x$ tracks that are marked as illegal for all colors of the one or more third colors except the two eighth colors, wherein the any one of the two eighth colors is a different color than the color of the $1x$ tracks of the one or more $1x$ tracks that are adjacent to the any $1x$ tracks of the one or more $1x$ tracks marked as illegal for all colors except the two eighth colors of the one or more third colors; and program instructions to assign a ninth color of the one or more third colors to any remaining uncolored $1x$ tracks of the each $1x$ track of the one or more $1x$ tracks, wherein the ninth color is a different color than the color of the $1x$ tracks of the one or more $1x$ tracks that are adjacent to the any remaining uncolored $1x$ tracks of the each $1x$ track of the one or more $1x$ tracks.

15. A computer system for constructing a colorable wiring layout, the computer system comprising:

one or more computer processors;

one or more computer readable storage media; and program instructions stored on the one or more computer readable storage media for execution by at least one of the one or more computer processors, the stored program instructions comprising:

program instructions to receive a system ground rules, a minimum wire width, a minimum spacing, and a set of one or more colors, wherein each color of the set of one or more colors represents a mask;

program instructions to create a track layout, wherein the track layout includes a two power tracks, a one or more $1x$ tracks, and a one or more wide tracks, wherein the width of the one or more $1x$ tracks is the minimum wire width;

program instructions to assign any first color of the set of one or more colors to each power track of the two power tracks, wherein the any first color may be different for each power track;

program instructions to assign any second color of the set of one or more colors to each wide track of the one or more wide tracks, wherein the any second color may be different for each wide track;

program instructions to determine one or more third colors of the set of one or more colors for each $1x$ track of the one or more $1x$ tracks, wherein the one or more third colors are legal for the each $1x$ track based on the system ground rules; and program instructions to assign a fourth color of the one or more third colors to the each $1x$ track of the one or more $1x$ tracks, based on the determination of the one or more third colors that are legal for the each $1x$ track.

16. The computer system of claim 15, wherein program instructions to create a track layout, wherein the track layout includes a two power tracks, a one or more $1x$ tracks, and a one or more wide tracks comprises:

program instructions to calculate a spacing between the two power tracks based on the system ground rules, the minimum wire width, and the minimum spacing, wherein an odd number of the one or more $1x$ tracks fit between the two power tracks;

program instructions to place the one or more $1x$ tracks between the two power tracks based on the spacing between the two power tracks;

program instructions to place a one or more $3x$ tracks between the two power tracks based on the spacing between the two power tracks, wherein the one or more $3x$ tracks are wide tracks of the one or more wide tracks, having a $3x$ width that is three times the minimum wire width, and wherein each 3x track is centered above two adjacent 1x tracks of the one or more 1x tracks; and program instructions to place a one or more 5x tracks between the two power tracks based on the spacing between the two power tracks, wherein the one or more 5x tracks are wide tracks of the one or more wide tracks, having a 5x width that is five times the minimum wire width, and wherein each 5x track is centered above three adjacent 1x tracks of the one or more 1x tracks.

17. The computer system of claim 16, wherein the 3x width is about three times the minimum wire width; and wherein the 5x width is about five times the minimum wire width.

18. The computer system of claim 15, wherein program instructions to assign any second color of the set of one or more colors to each wide track of the one or more wide tracks, wherein the any second color may be different for each wide track comprises:

program instructions to assign a mask3 color of the set of one or more colors to every even numbered 5x track of the one or more 5x tracks, wherein the one or more 5x tracks are wide tracks of the one or more wide tracks, and wherein the 5x width is five times the minimum wire width;

program instructions to assign a mask4 color of the set of one or more colors to every second odd numbered 5x track of the one or more 5x tracks, starting with the first odd numbered 5x track;

program instructions to assign a mask2 color of the set of one or more colors to every second odd numbered 5x track of the one or more 5x tracks, starting with the second odd numbered 5x track; and program instructions to assign the mask2 color of the set of one or more colors, a mask1 color of the set of one or more colors, and the mask3 color of the set of one or more colors to the 3x tracks of the one or more 3x tracks, wherein the assignment repeats the sequence of mask2 color, mask1 color, and mask3 color, and wherein the one or more 3x tracks are wide tracks of the one or more wide tracks, and wherein the 3x width is three times the minimum wire width.

19. The computer system of claim 15, wherein program instructions to determine one or more third colors of the set of one or more colors for each 1x track of the one or more 1x tracks, wherein the one or more third colors are legal for the each 1x track based on the system ground rules comprises:

program instructions to mark as illegal for a 3x color of the set of one or more colors, any 1x tracks of the each 1x track of the one or more 1x tracks that are located between two 3x tracks of the one or more 3x tracks that are both colored the 3x color, wherein there are four or fewer 1x tracks between the two 3x tracks, and wherein the one or more 3x tracks are wide tracks of the one or more wide tracks, and wherein the 3x width is three times the minimum wire width;

program instructions to mark as illegal for a 5x color of the set of one or more colors, any 1x tracks of the each 1x track of the one or more 1x tracks that are located within two 1x tracks of a border of a 5x track of the one or more 5x tracks that is colored the 5x color, wherein the one or more 5x tracks are wide tracks of the one or more wide tracks, and wherein the 5x width is five times the minimum wire width; and program instructions to mark as illegal for a fifth color of the set of one or more colors, any 1x tracks of the each 1x track of the one or more 1x tracks that are adjacent to the border of a 3x track of the one or more 3x tracks that is colored the fifth color.

20. The computer system of claim 15, wherein assigning, by one or more computer processors, a fourth color of the one or more third colors to the each 1x track of the one or more 1x tracks, based on the determination of the one or more third colors that are legal for the each 1x track comprises:

program instructions to assign a sixth color of the one or more third colors to the each 1x track of the one or more 1x tracks that are adjacent to each power track of the two power tracks, wherein the sixth color is a different color than the color of the adjacent power track;

program instructions to assign a seventh color of the one or more third colors to the each 1x track of the one or more 1x tracks marked as illegal for all colors of the set of one or more colors except the seventh color;

program instructions to mark as illegal for the seventh color of the one or more third colors, any 1x tracks of the each 1x track of the one or more 1x tracks that are adjacent to the each 1x track of the one or more 1x tracks marked as illegal for all colors of the set of one or more colors except the seventh color;

program instructions to choose any 1x tracks of the each 1x track of the one or more 1x tracks that are marked as illegal for all colors of the one or more third colors except a two eighth colors of the one or more third colors;

program instructions to assign any one of the two eighth colors of the one or more third colors to the any 1x tracks of the each 1x track of the one or more 1x tracks that are marked as illegal for all colors of the one or more third colors except the two eighth colors, wherein the any one of the two eighth colors is a different color than the color of the 1x tracks of the one or more 1x tracks that are adjacent to the any 1x tracks of the one or more 1x tracks marked as illegal for all colors except the two eighth colors of the one or more third colors; and program instructions to assign a ninth color of the one or more third colors to any remaining uncolored 1x tracks of the each 1x track of the one or more 1x tracks, wherein the ninth color is a different color than the color of the 1x tracks of the one or more 1x tracks that are adjacent to the any remaining uncolored 1x tracks of the each 1x track of the one or more 1x tracks.

* * * * *